US007696828B2

(12) United States Patent
Chang

(10) Patent No.: US 7,696,828 B2
(45) Date of Patent: Apr. 13, 2010

(54) MULTI-LINEARITY MODE LNA HAVING A DEBOOST CURRENT PATH

(75) Inventor: Li-Chung Chang, Irvine, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 28 days.

(21) Appl. No.: 11/969,375

(22) Filed: Jan. 4, 2008

(65) Prior Publication Data
US 2009/0174481 A1 Jul. 9, 2009

(51) Int. Cl.
H03F 3/04 (2006.01)
H03G 3/12 (2006.01)
(52) U.S. Cl. ...................... 330/311; 330/283
(58) Field of Classification Search .............. 330/311, 330/283, 285
See application file for complete search history.

(56) References Cited

U.S. PATENT DOCUMENTS

| 4,791,521 | A | * | 12/1988 | Ouyang et al. ............. 361/91.3 |
| 6,781,467 | B2 | | 8/2004 | Sun |
| 7,319,364 | B2 | | 1/2008 | Kim et al. |
| 7,362,183 | B2 | * | 4/2008 | Kim et al. ................... 330/311 |
| 2003/0112078 | A1 | * | 6/2003 | Rategh et al. ............... 330/311 |
| 2005/0176399 | A1 | | 8/2005 | Aparin |
| 2008/0084682 | A1 | * | 4/2008 | Huynh et al. ................ 361/820 |

OTHER PUBLICATIONS

Sivakumar Ganesan, "Highly Linear Low Noise Amplifier," Thesis, May 2006.
Aparin, et al., "Modified derivative superposition method for linearizing FET low noise amplifiers," 2004 IEEE Radio Frequency Integrated Circuits (RFIC) Symposium, Digest of Papers, Fort Worth, TX, Jun. 6-8, 2004, pp. 105-108, XP010714259.
Yanduru, et al., "A WCDMA, GSM/GPRS/EDGE Receiver Front End without Interstage SAW Filter," 2006 IEEE Radio Frequency Integrated Circuits (RFIC) Symposium, Piscataway, NJ, Jun. 11, 2006, pp. 9-12, XP010925083.

* cited by examiner

Primary Examiner—Robert Pascal
Assistant Examiner—Khiem D Nguyen
(74) Attorney, Agent, or Firm—Ramin Mobarhan

(57) ABSTRACT

A modified derivative superposition (MDS) low noise amplifier (LNA) includes a main current path and a cancel current path. Third-order distortion in the cancel path is used to cancel third-order distortion in the main path. In one novel aspect, there is a separate source degeneration inductor for each of the two current paths, thereby facilitating tuning of one current path without affecting the other current path. In a second novel aspect, a deboost current path is provided that does not pass through the LNA load. The deboost current allows negative feedback to be increased without generating headroom problems. In a third novel aspect, the cancel current path and/or deboost current path is programmably disabled to reduce power consumption and improve noise figure in operational modes that do not require high linearity.

21 Claims, 8 Drawing Sheets

LNA HAVING SEPARATE DEGENERATION
INDUCTORS WITH DEBOOST

LNA HAVING SEPARATE DEGENERATION
INDUCTORS WITH DEBOOST

THIRD ORDER INTERMODULATION DISTORTION

TRIPLE BEAT DISTORTION IN A CDMA SYSTEM

THIRD ORDER NON-LINEARITY TRANSFER
CHARACTERISTICS

THIRD ORDER NON-LINEARITY TRANSFER
CHARACTERISTICS IN DS MODE

LAYOUT OF SEPARATE DEGENERATION
INDUCTORS

LNA HAVING SEPARATE DEGENERATION
INDUCTORS WITH DEBOOST

LNA IIP3 VS CANCEL TRANSISTOR BIAS CURRENT

| PERFORMANCE | LINEARITY IIP3 | NOISE FIGURE | TOTAL LNA BIAS CURRENT |
|---|---|---|---|
| HIGH LINEARITY MODE | +8 dBM | 5 dB | 20 mA |
| LOW LINEARITY MODE | 0 dBM | 3 dB | 10 mA |

LNA PERFORMANCE PARAMETERS IN
TWO MODES

MULTI-LINEARITY MODE LNA HAVING A DEBOOST CURRENT PATH

BACKGROUND INFORMATION

1. Technical Field

The disclosed embodiments relate generally to wireless communication devices and, more specifically, to low noise amplifiers.

2. Background Information

Radio receivers, such as Code Division Multiple Access (CDMA) cellular telephone receivers, generally include amplifiers called low noise amplifiers (LNAs). The CDMA cellular telephone application requires that the LNAs have a very high third-order input intercept point ($IIP_3$) as well as a low noise factor (NF), a high gain, and a low current consumption. There are several linearization techniques that are used to achieve these performance characteristics.

One popular technique involves the use of negative feedback. In a conventional source-degenerated LNA, a source degeneration inductor is used as a feedback circuit. In general, higher linearity may be achieved by increasing the source degeneration inductance and/or by increasing the LNA bias current. Source-degenerated LNAs, however, still suffer from poor linearity due to a second order non-linearity feedback effect. Furthermore, LNAs with larger source degeneration inductances exhibit lower gain and higher noise factor, and the increasing of bias current causes higher power consumption. If bias current is increased too much, then headroom problems are encountered.

A second technique is the derivative superposition (DS) technique. The DS technique uses two or more parallel FETs of different gate widths and gate biases to achieve high linearity and enhanced IIP3 performance. However, the conventional DS method does not significantly increase IIP3 performance at high frequencies due to a second-order nonlinearity contribution to the third-order intermodulation distortion ($IMD_3$).

The modified DS (MDS) technique addresses the second-order nonlinearity contribution. In the modified DS techniques, the magnitude and phase of the third-order nonlinearity contribution to IMD3 is tuned to cancel the second-order non-linearity contribution to IMD3, thereby generating an output current with very low IMD3.

FIG. 1 (Prior Art) is a circuit diagram of an LNA 100 that utilizes the MDS technique. In the MDS circuit of FIG. 1, two FETs 104A and 104B are used. FET 104A is biased in its sub-threshold region (weak inversion) and FET 104B is biased in its saturation region (strong inversion). It is known in the art that the third order nonlinearity contribution component ($g_3$) to IMD3 of a FET changes from positive to negative as the FET operation changes from weak inversion to strong inversion. This means that when the two FETs 104A and 104B are biased at the positive and negative peaks of $g_3$ with equal magnitude, the output currents by the two FETS 104A and 104B are summed and the result is an output current with near zero IMD3. The MDS technique also takes into account the second order nonlinearity contribution component ($g_2$) to IMD3. As illustrated in FIG. 1, a tapped inductor 102 is used such that the magnitude and the phase of $g_3$ is tuned to cancel $g_2$. See Published U.S. Patent Application No. 2005/0176399, published Aug. 11, 2005, for a more detailed explanation of the operation of an LNA that employs the Modified Derivative Superposition (MDS) technique.

FIG. 2 (Prior Art) is a circuit diagram of an LNA 120 that utilizes a variation of the MDS technique. In the MDS circuit of FIG. 2, two FETs 122 and 124 and two inductors 126 and 128 are used. The same general MDS technique of phase cancellation as illustrated in FIG. 1 is used in LNA 120 of FIG. 2 to achieve high linearity. However, by connecting the gate of auxiliary transistor 124 to the source of main transistor 122, LNA 120 of FIG. 2 further improves NF. Moreover, connecting the gate of auxiliary transistor 124 to the source of main transistor 122, allows tuning for input match and linearity to be conducted independently. For further information on this variation of the MDS technique, see: "Highly Linear Low Noise Amplifier", Texas A&M Master of Science Thesis by Sivakumar Ganesan, pages 1-73, May 2006.

When strong jammer tones are present, an LNA in a CDMA cellular telephone must have high linearity and low distortion. Such high linearity performance is usually achieved using the MDS technique in combination with increased bias current of the LNA. The degree to which the bias current can be increased is, however, limited. On the other hand, when no jammer tones are present, the LNA can have lower linearity and lower power consumption in order to extend battery life of the CDMA cellular telephone.

SUMMARY

A modified derivative superposition (MDS) low noise amplifier (LNA) includes a main current path and a cancel current path. In the main current path, a main current $I_{MAIN}$ flows through a load, through a main field effect transistor (FET), and through a first source degeneration inductor. In the cancel current path, a cancel current $I_{CANCEL}$ flows through the load, through a cancel FET, and through a second source degeneration inductor. The LNA current is the summation of $I_{MAIN}$ and $I_{CANCEL}$. Third-order distortion in $I_{CANCEL}$ is used to cancel third-order distortion in $I_{MAIN}$ and therefore results in a zero third-order intermodulation distortion (IMD3) in the output current. In one novel aspect, the first source degeneration inductor in the main current path is a separate inductor form the second source degeneration inductor in the cancel current path, thereby facilitating tuning of one current path without affecting the other current path. As a result, the LNA can be optimized with less iteration because the main current and the cancel current are decoupled through the use of two separate source degeneration inductors.

In a second novel aspect, a deboost current path is provided. In the deboost current path, the deboost current $I_{DEBOOST}$ flows through a deboost transistor, and through the first source degeneration inductor. The deboost current does not flow through the LNA load. The deboost current allows more negative feedback to be provided by the first source degeneration inductor without decreasing the voltage headroom of the main FET. Therefore, higher linearity performance of the LNA can be achieved. In one example, the deboost current $I_{DEBOOST}$ can be changed during design of the LNA by changing the size of the deboost transistor. Accordingly, the negative feedback associated with the main current path can also be adjusted by adjusting the deboost current. The adjustability of the negative feedback factor provides extra tuning capability for optimal current cancellation. As a result, the LNA can be optimized with fewer design iterations.

In a third novel aspect, the LNA is programmable to operate in two different operational modes: a high linearity mode and a low linearity mode. When there is a receive jammer or a transmit leakage present, the LNA operates in the high linearity mode. In the high linearity mode, both the deboost current path and the cancel current path are enabled in order to achieve high linearity performance. On the other hand, when there is no receive jammer or transmit leakage present, the LNA operates in the low linearity mode. In the low linearity mode, the deboost current path is programmably disabled to reduce power consumption. In one example, the cancel current path is also disabled to improve the noise figure (NF) of the LNA.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 3:
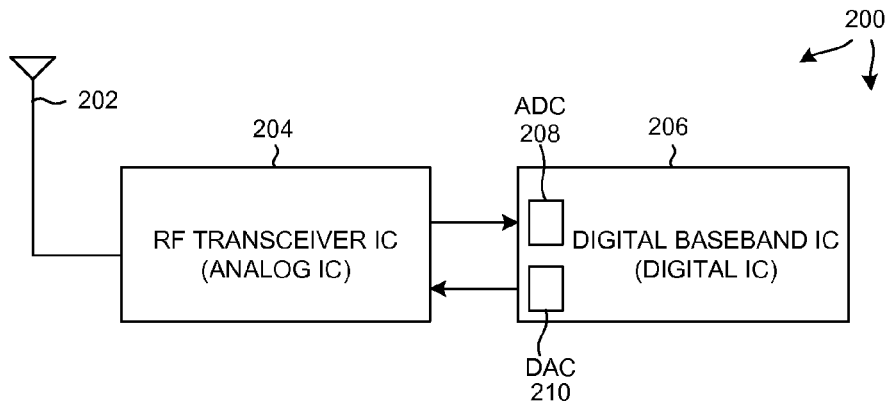
FIG. 3 is a very simplified high level block diagram of one particular type of mobile communication device 200 in accordance with one novel aspect.

FIG. 3 is a very simplified high level block diagram of one particular type of mobile communication device 200 in accordance with one novel aspect. In this example, mobile communication device 200 is a cellular telephone that uses the CDMA 2000 cellular telephone communication protocol. The cellular telephone includes (among several other parts not illustrated) an antenna 202 and two integrated circuits 204 and 206. Integrated circuit 206 is called a "digital baseband integrated circuit" or a "baseband processor integrated circuit". Integrated circuit 204 is an RF transceiver integrated circuit. RF transceiver integrated circuit 204 is called a "transceiver" because it includes a transmitter as well as a receiver.

Figure 4:
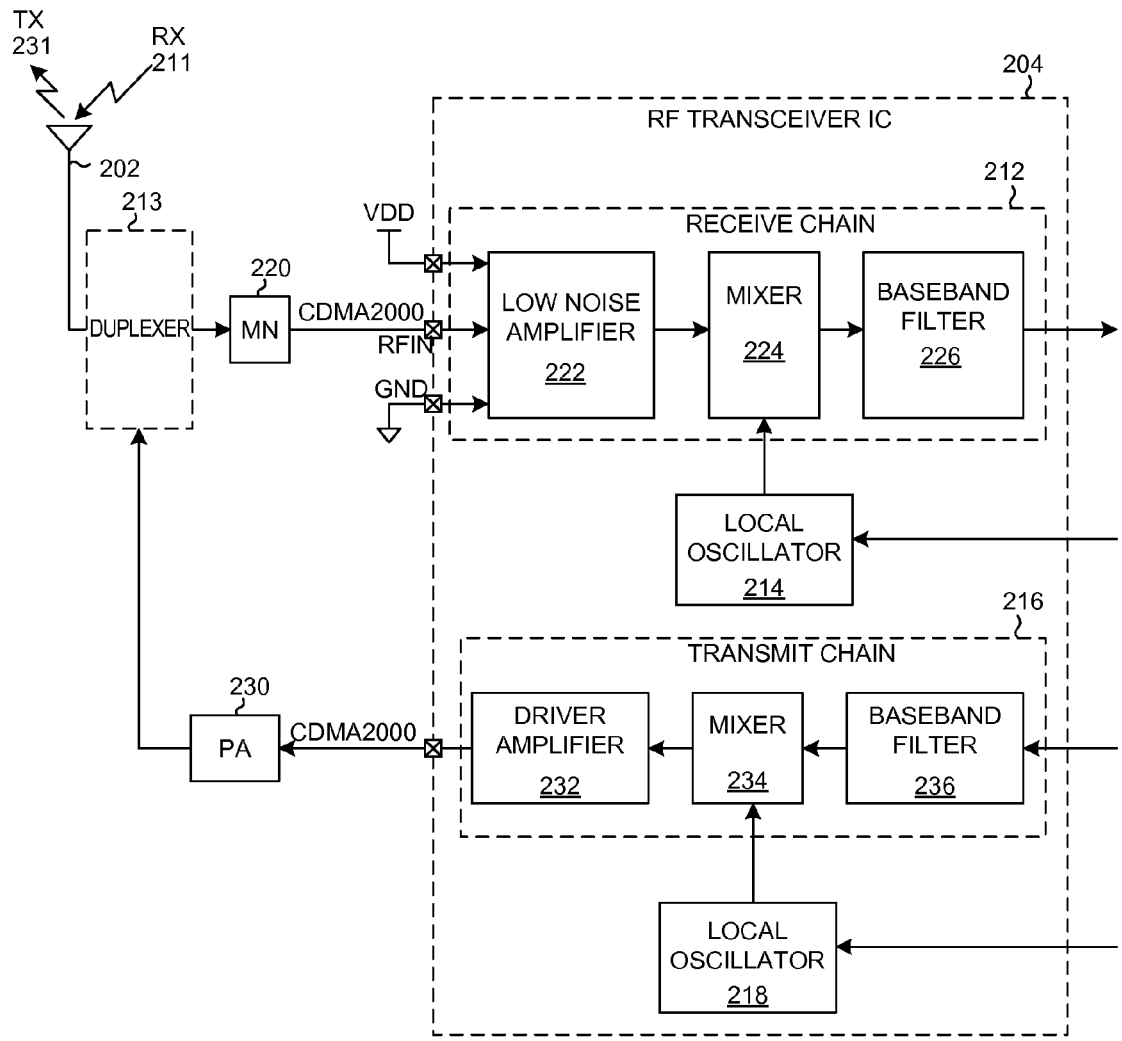
FIG. 4 is a more detailed block diagram of the RF transceiver integrated circuit 204 of FIG. 3.

FIG. 4 is a more detailed block diagram of the RF transceiver integrated circuit 204 of FIG. 3. The receiver includes what is called a "receive chain" 212 as well as a local oscillator (LO) 214. When cellular telephone 200 is receiving, a high frequency RF signal 211 is received on antenna 202. Information from signal 211 passes through duplexer 213, matching network 220, and through the receive chain 212. RF signal 211 is amplified by low noise amplifier (LNA) 222 and is down-converted in frequency by mixer 224. The resulting down-converted signal is filtered by baseband filter 226 and is passed to the digital baseband integrated circuit 206. An analog-to-digital converter 208 in the digital baseband integrated circuit 206 converts the signal into digital form and the resulting digital information is processed by digital circuitry in the digital baseband integrated circuit 206.

If cellular telephone 200 is transmitting, then information to be transmitted is converted into analog form by a digital-to-analog converter 210 in digital baseband integrated circuit 206 and is supplied to a "transmit chain" 216. Baseband filter 236 filters out noise due to the digital-to-analog conversion process. Mixer block 234 under control of local oscillator (LO) 218 then up-converts the signal into a high frequency signal. Driver amplifier 232 and an external power amplifier 230 amplify the high frequency signal and pass the high frequency signal through duplexer 213 to drive antenna 202 so that a high frequency RF signal 231 is transmitted from antenna 202.

Figure 5:
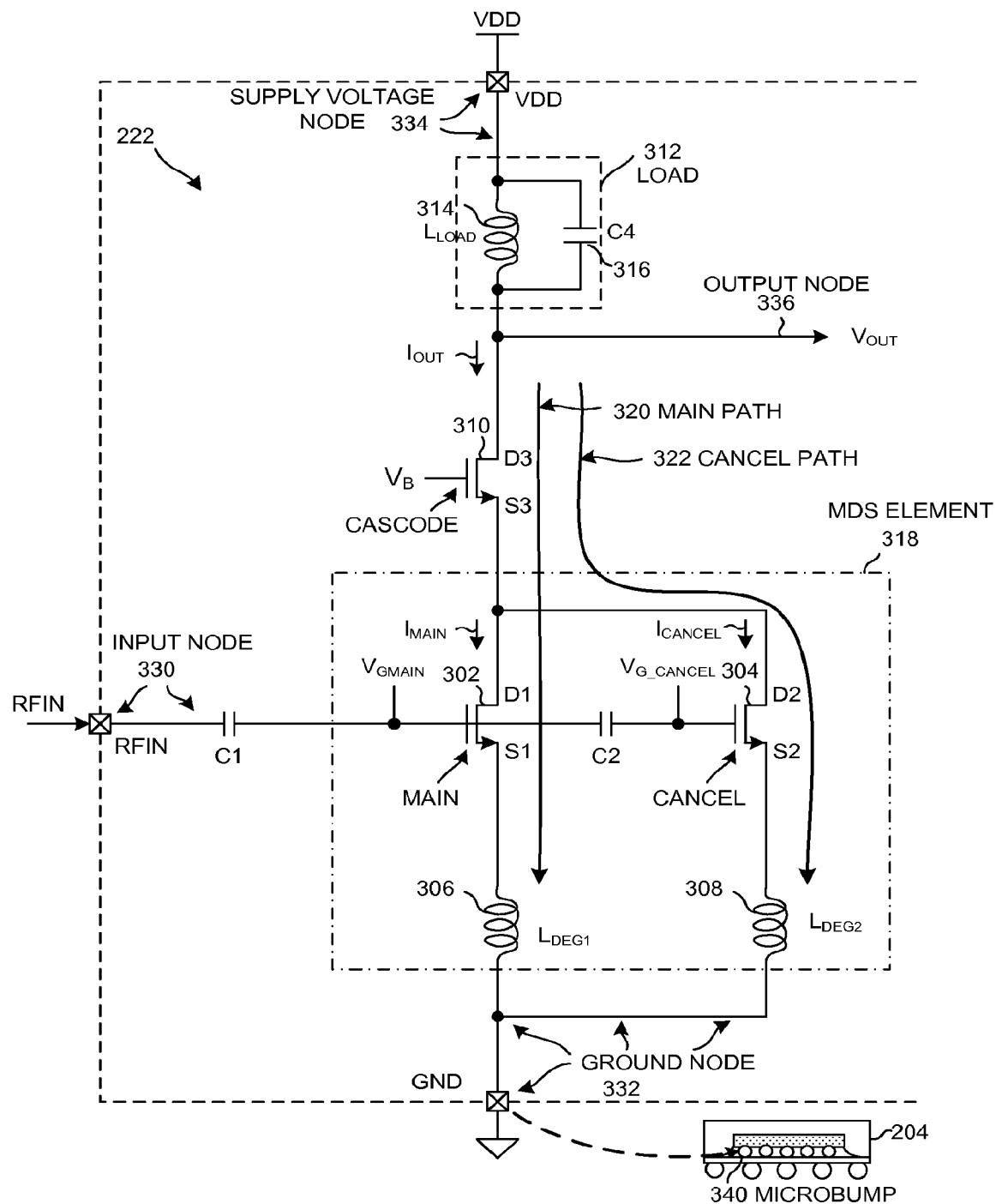
FIG. 5 is a circuit diagram of a low noise amplifier (LNA) 222 of FIG. 4 that has two separate source degeneration inductors.

FIG. 5 is a detailed circuit diagram of low noise amplifier (LNA) 222 of FIG. 4 in accordance with one novel aspect. LNA 222 includes a main field effect transistor (FET) 302, a cancel FET 304, a first source degeneration inductor 306, a second source degeneration inductor 308, a cascode transistor 310, and an LNA load 312. LNA load 312 is an LC tank circuit that includes an inductor 314 and a capacitor 316 coupled in parallel. Main FET 302 receives an RF signal from an input node RFIN 330 through an AC coupling capacitor C1. Cancel FET 304 receives the RF signal from input node RFIN 330 through an additional AC coupling capacitor C2. A source S1 of main FET 302 is coupled to a ground node GND 332 through first source degeneration inductor 306. A source S2 of cancel FET 304 is coupled to the ground node GND 332 through second source degeneration inductor 308. A drain D1 of main FET 302 is connected to a drain D2 of cancel FET 304. Drain D1 and drain D2 are connected to a source S3 of cascode transistor 310. A drain D3 of cascode transistor 310 is coupled to a voltage supply node VDD 334 through load 312. Drain D3 is also coupled to an output voltage node $V_{OUT}$ 336. Main FET 302 is biased at a bias voltage $V_{G\_MAIN}$ such that main FET 302 is biased in its saturation (also known as strong inversion) operating region. Cancel FET 304 is biased at a bias voltage $V_{G\_CANCEL}$ such that cancel FET 304 is biased in its sub-threshold (also known as weak inversion) operating region.

In the embodiment of FIG. 5, main FET 302, cancel FET 304, and two separate source degeneration inductors 306 and 308 form a Modified Derivative Superposition (MDS) element 318. Main FET 302 and cancel FET 304 have mutually connected drains and are driven by the same RF signal received from input node RFIN 330. For an input gate-to-source voltage $V_{GS}$ around the bias point, main FET 302 generates a drain-to-source current $I_{MAIN}$ and cancel FET 304 generates a drain-to-source current $I_{CANCEL}$. The overall LNA current (denoted output current $I_{OUT}$) is a summation of $I_{MAIN}$ and $I_{CANCEL}$, i.e., $I_{OUT}=I_{MAIN}+I_{CANCEL}$. Cascode transistor 310 is biased at bias voltage $V_B$ and is used as a current buffer to isolate MDS element 318 from load 312 and output node 336.

The linearity of the receiver of transceiver integrated circuit 204 of FIG. 4 is dominated by the performance of LNA 222 of FIG. 5. Main FET 302 of LNA 222 is a non-linear device and generates various output frequency components, also known as distortions. In mathematical expression, main FET 302 biased at saturation region generates a small-signal drain-to-source current $I_{MAIN}$ that can be described by Taylor-series expansion of equation (1) in terms of the small-signal gate-source voltage $V_{GS}$ around the bias point:

$$I_{MAIN}(V_{GS})=g_1 V_{GS}+g_2 V_{GS}^2+g_3 V_{GS}^3 \quad (1)$$

where $g_1$ represents the small-signal transconductance of FET 302, and $g_2$ and $g_3$ are the second-order and third-order transconductance coefficients, which lead to the generation of distortions. Among the transconductance coefficients, $g_3$ has particular importance because it controls the third-order intermodulation distortion (IMD3) and thus determines the third order input intercept point (IIP$_3$). IIP$_3$ is a figure of merit that is commonly used to characterize nonlinearity. The amplitude of IIP$_3$ can be expressed according to equation (2) as follows:

$$\text{IIP}_3=\sqrt{(4/3)|g1/g3|} \quad (2)$$

Intermodulation distortion is a type of distortion that can be modeled by two strong jammer tones appearing at the input. In one example, the two jammer tones are two closely frequency spaced, equal amplitude tones applied to main FET 302, i.e., $V_{GS}=A\cos\omega_1 t+A\cos\omega_2 t$, where $\omega_1$ and $\omega_2$ represent two closely spaced frequencies. By substituting the above jammer tones into equation (1), the output current $I_{MAIN}$ contains new frequency components including the $(2\omega_1-\omega_2)$ and $(2\omega_2-\omega_1)$ frequency components. These two frequency components represent the third-order intermodulation distortion (IMD3). As described in more detail in the following paragraph, IMD3 is the most problematical intermodulation distortion because it falls within the pass band of transceiver 204 and corrupts the input signal.

Figure 6:
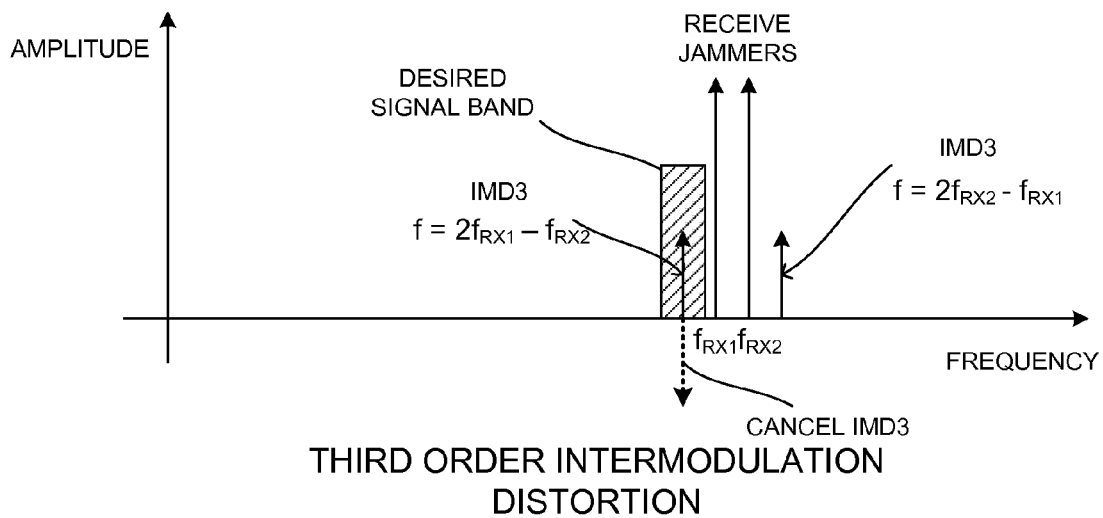
FIG. 6 is a graph that illustrates third order intermodulation distortion (IMD3) modeled by two adjacent channel receive-jammers.

FIG. 6 is a graph that illustrates third order intermodulation distortion (IMD3) modeled by two adjacent channel receive-jammers. In the example of FIG. 6, the desired RF signal band has a center frequency of 1 GHz with a bandwidth of 1 MHz. This means that any RF signal having a frequency between 0.999 GHz and 1.001 GHz falls within the pass band of transceiver 204. In addition to the desired RF signal, there are two receive RF signals with a first frequency $f_{RX1}=1.001$ GHz and a second frequency $f_{RX2}=1.002$ GHz. These two receive RF signals are also called adjacent channel receive-jammers. The presence of the receive-jammers results in two third-order distortion components: one IMD3 has a frequency component of $(2f_{RX2}-f_{RX1})$ which is equal to 1.003 GHz, and another IMD3 has a frequency component of $(2f_{RX1}-f_{RX2})$ which is equal to exactly 1 GHz. As illustrated in FIG. 6, the 1 GHz IMD3 component falls within the desired signal band. This in-band IMD3 component corrupts the input signal because it cannot be filtered out.

In a CDMA 2000 duplex system such as transceiver 204 of FIG. 4, the nonlinearity characteristic of LNA 222 also results in cross-modulation distortions that are caused by transmit-leakages. In the example of FIG. 4, both receiver chain 212 and transmitter chain 216 are operational at the same time, and duplexer 213 is used to combine receiver and transmitter signals. Because of the combination of receiver and transmitter signals, transmit-leakages may appear at the receive input simultaneously with a receiver-jammer. The interaction of the two transmit-leakages and the receive-jammer produces cross-modulation distortions. In one example, a type of third-order cross-modulation distortion, which is also known as triple-beat distortion, is modeled by two transmit-leakage signals and one receive-jammer.

Figure 7:
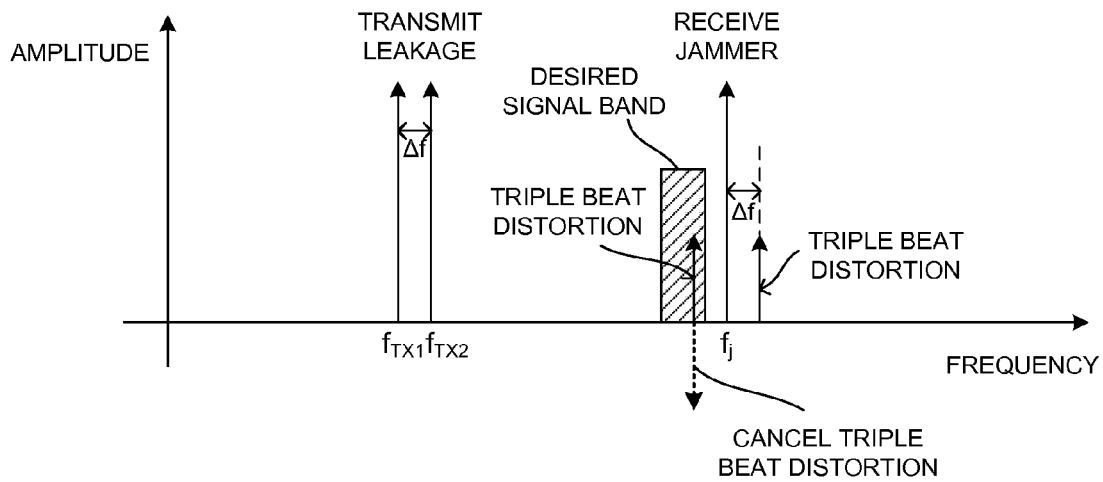
FIG. 7 is a graph that illustrates triple beat distortion modeled by two transmit-leakages and a receive-jammer in a CDMA system.

FIG. 7 is a graph that illustrates triple beat distortion modeled by two transmit-leakage signals and one receive-jammer. In the example of FIG. 7, the desired RF signal band has a center frequency of 1 GHz with a bandwidth of 1 MHz. This means that any RF signal having a frequency between 0.999 GHz and 1.001 GHz falls within the pass band of transceiver 204. In addition to the desired RF signal, there are two transmit-leakage signals with a first frequency $f_{TX1}=900$ MHz and a second frequency $f_{TX2}=900.4$ MHz. There is also a receive-jammer with a frequency of 1.001 GHz. The existence of the transmit-leakage signals and the receive-jammer results in a third-order triple-beat distortion component having a frequency of $(f_{RX1}-(f_{TX2}-f_{TX1}))$, which is equal to 1.006 GHz. As illustrated in FIG. 7, the 1.006 GHz triple-beat distortion component falls within the desired signal band. This triple-beat distortion component is problematic because it corrupts the input signal and cannot be filtered out.

The above described IMD3 and triple-beat distortions are both third-order distortions and are controlled by the third-order transconductance coefficient $g_3$. Therefore, in order to eliminate third-order distortions and improve linearity, it is of particular importance to be able to reduce the value of $g_3$ to near zero. From equation (1), transconductance coefficients $g_1$, $g_2$, and $g_3$ can be determined according to equation (3) as follows:

$$g_1=\partial I_{MAIN}/\partial V_{GS},\ g_2=\partial^2 I_{MAIN}/\partial V_{GS}^2,\ g_3=\partial^3 I_{MAIN}/\partial V_{GS}^3 \quad (3)$$

Figure 8:
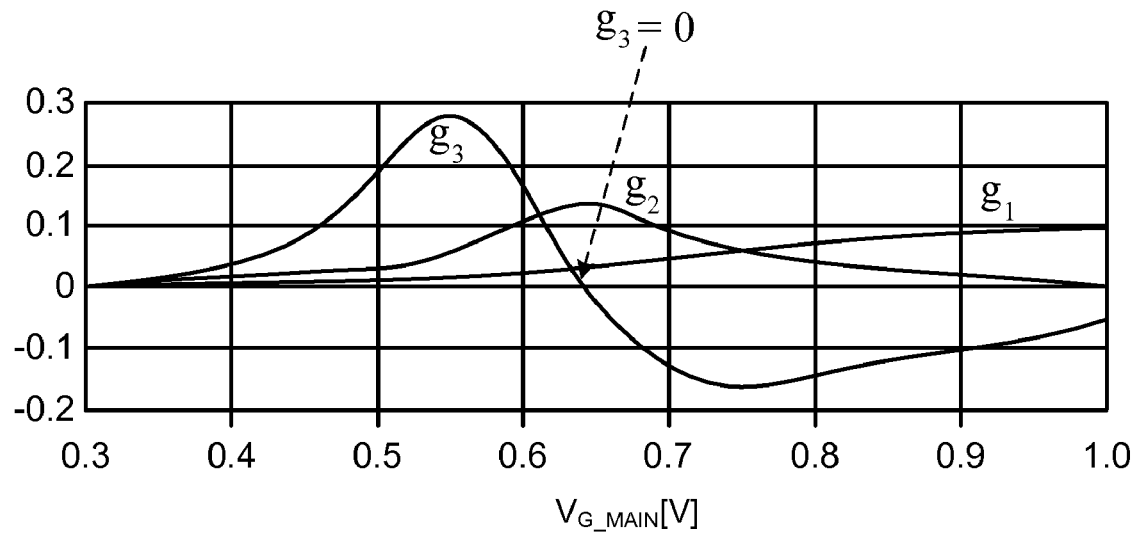
FIG. 8 is a graph showing third-order nonlinearity transfer coefficients.

FIG. 8 is a graph showing transconductance coefficients $g_1$, $g_2$ and $g_3$ in relation to a DC bias voltage $V_{G\_MAIN}$ of main FET 302 of FIG. 5. In the example of FIG. 8, when the bias of main FET 302 is changed from weak inversion to strong inversion, the third-order transconductance $g_3$ changes from positive to negative. When the bias voltage $V_{G\_MAIN}$ reaches a particular point (for example, $V_{G\_MAIN}=0.64$ volts), the third-order transconductance $g_3$ becomes zero. Accordingly, IIP$_3$ approaches infinity as $g_3$ becomes zero at this particular bias point. However, this significant IIP$_3$ improvement occurs only in a very small range of $V_{G\_MAIN}$. This particular bias point is difficult to achieve and is bound to change due to process, temperature and supply voltage variations.

Figure 9:
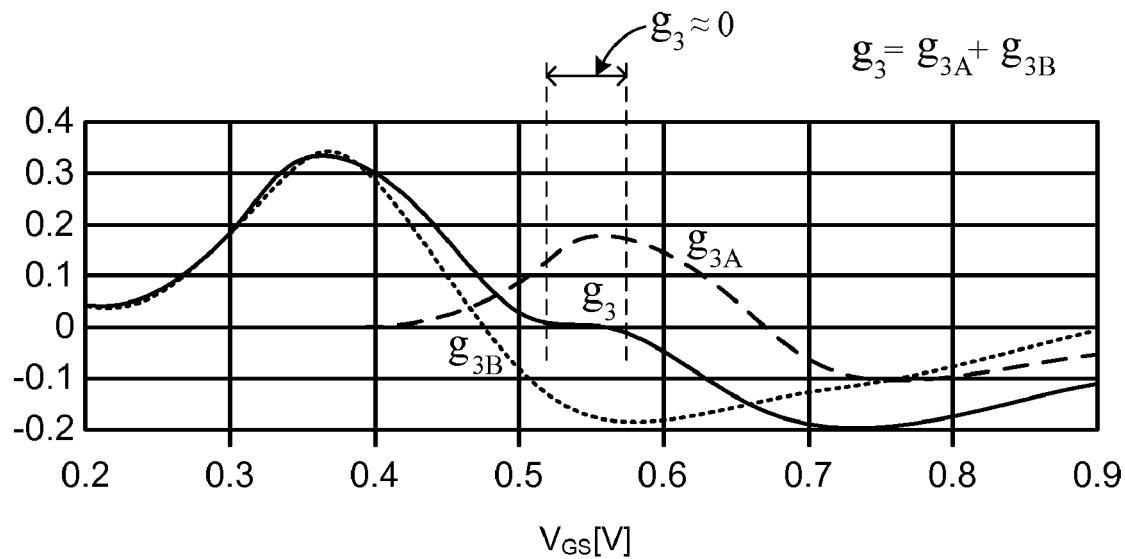
FIG. 9 is a graph that illustrates a cancelling of third-order non-linearity transfer coefficients in the Derivative Superposition (DS) technique.

FIG. 9 is a graph showing how third-order nonlinearity transconductance coefficients are made to cancel each other in the Derivative Superposition (DS) technique. As illustrated in FIG. 5, two transistors, main FET 302 and cancel FET 304, are connected in parallel. If the output currents of the two transistors are added when the bias points are at the positive and negative peaks of $g_3$, and if the two transistors are scaled such that the positive and negative peaks of $g_3$ are equal in magnitude, then the composite output current $I_{OUT}$ would have a zero $g_3$ over a wide range of bias values. In the example of FIG. 9, $g_{3A}$ and $g_{3B}$ represent the transconductance coefficients of the two transistors biased in different regions. The resulting composite $g_3$ ($g_3=g_{3A}+g_{3B}$) is approximately zero and the theoretical amplitude of IIP$_3$ is significantly improved over a wide range of gate biases. However, the improvement in IIP$_3$ only occurs for very low frequencies at which the effect of circuit reactance is negligible. At high frequencies, source degeneration inductor 306 creates a strong feedback path for the drain-to-source current $I_{MAIN}$. As a result, second-order nonlinearity (controlled by $g_2$) also contributes to the IMD3. Therefore the conventional DS method provides no IIP$_3$ improvement at high frequencies.

Figure 1:
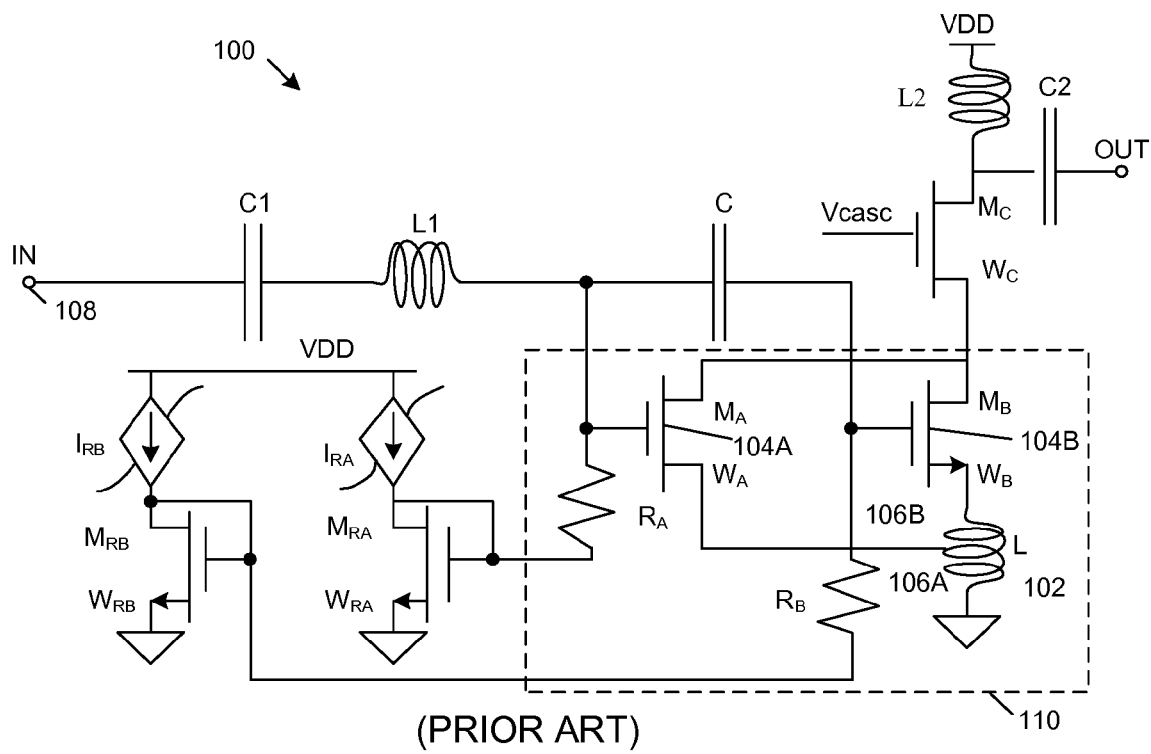
FIG. 1 (Prior Art) is a circuit diagram of an LNA 100 that utilizes the Modified Derivative Superposition (MDS) technique.
Figure 2:
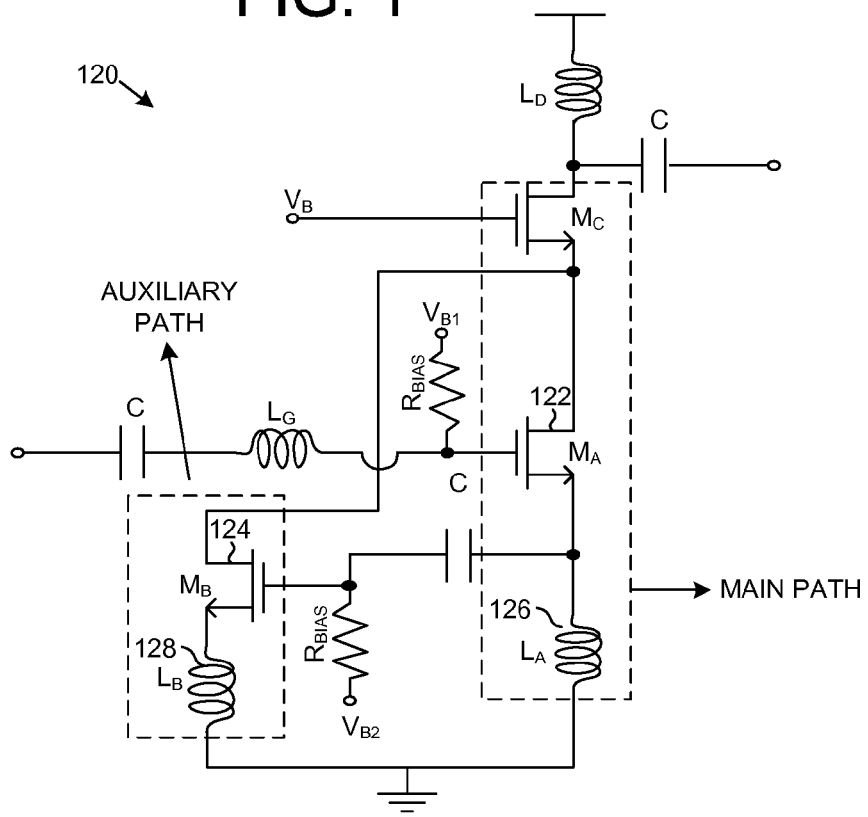
FIG. 2 (Prior Art) is a circuit diagram of an LNA 120 that utilizes a variation of the MDS technique.

The modified derivative super-position (MDS) technique addresses the problem of the second order nonlinearity contribution. As illustrated in FIG. 1 (Prior Art), the magnitude and phase of a third-order nonlinearity contribution ($g_3$) to IMD3 is tuned to cancel a second-order nonlinearity contribution ($g_2$) to IMD3 by using a tapped inductance 102 for source degeneration. With proper selection of the tap point, the FET gate widths, and the biases, the overall IMD3 can be made to have a value of approximately zero over a wide range of biases. However, in the example of FIG. 1, the drain-to-source currents of FET 104A and FET 104B are coupled through tapped inductance 102. A change in the tap point would in turn impact the drain-to-source currents of both FET 104A and FET 104B. Therefore, many design iterations are required to fine tune the tap point, the FET gate widths, and the biases in order to achieve an optimized result. Due to the coupling of the two FET drain-to-source currents, it is sometimes difficult and laborious to make the overall IMD3 near zero.

The novel LNA 222 of FIG. 5 overcomes these difficulties by employing two separate source degeneration inductors 306 and 308. As illustrated in FIG. 5, output current $I_{OUT}$ includes two current paths, a main current path 320 and a cancel current path 322. In main current path 320, main current $I_{MAIN}$ flows through main FET 302 and source degeneration inductor 306. In cancel current path 322, cancel current $I_{CANCEL}$ flows through cancel FET 304 and source degeneration inductor 308. By using source degeneration inductors 306 in main path 320 and source degeneration inductor 308 in cancel path 322, main current $I_{MAIN}$ and cancel current $I_{CANCEL}$ are no longer coupled together as in the conventional circuit of FIG. 1. In a novel design process, a first step is to design main path 320 to ensure basic performance characteristics of LNA 222. For example, the gate width and bias point of main FET 302 and the inductance of source degeneration inductor 306 are carefully selected to achieve low noise figure, high gain, low power consumption, and relatively high linearity. In a second step, the cancel path is realized and tuned to improve linearity. As described earlier, main FET 302 is biased at its saturation region and has a negative third-order contribution to IMD3. On the other hand, cancel FET 304 is biased at its sub-threshold region and has a positive third-order contribution to IMD3. More specifically, the MDS method also takes into account the second-order nonlinearity contribution to IMD3. By properly selecting the gate width and bias point of cancel FET 304 and the inductance of source degeneration inductor 308, the IMD3 of current $I_{CANCEL}$ is tuned to cancel the IMD3 of current $I_{MAIN}$. Because main path 320 and cancel path 322 are decoupled through the use of two separate inductors 306 and 308, changes made to the cancel path 322 do not have a big impact on the operation of main path 320. Accordingly, the novel LNA 222 of FIG. 5 can be optimized with less iteration as compared to the conventional LNA of FIG. 1 that employs a tapped inductor.

Figure 10:
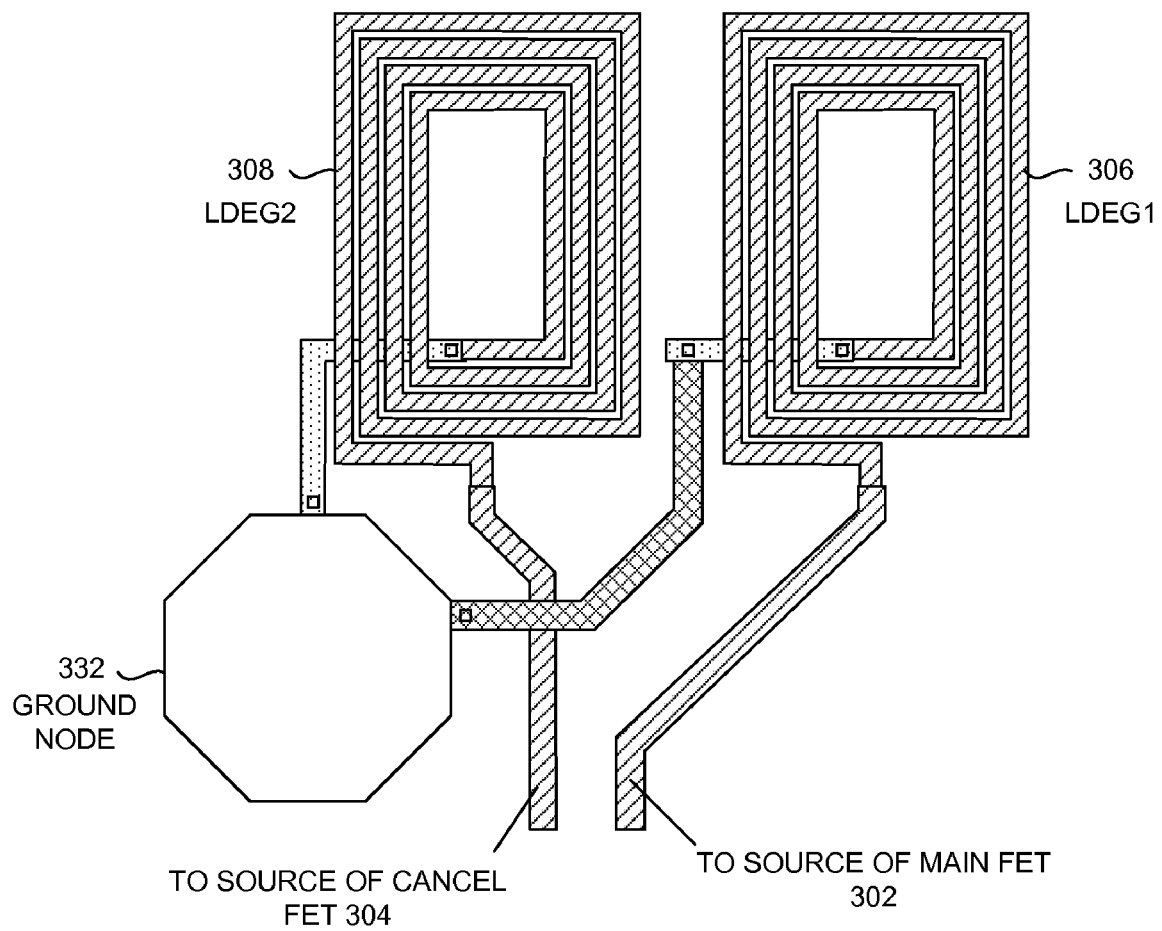
FIG. 10 is a simplified layout of the two separate source degeneration inductors of FIG. 5.

FIG. 10 is a simplified layout diagram that shows the two source degeneration inductors 306 and 308 of FIG. 5. As illustrated in FIG. 10, source degeneration inductor 306 is an integrated spiral inductor with one lead connected to ground node 332, and another lead connected to source S1 of main FET 302. Source degeneration inductor 308 is also an integrated spiral inductor with one lead connected to ground node 332, and another lead connected to source S2 of cancel FET 304. In one example, $L_{DEG1}$ is has an inductance of 1.8 nanoHenries, $L_{DEG2}$ has an inductance of 1.6 nanoHenries, and ground node 332 is connected to a surface mount microbump (for example, microbump 340 as illustrated in FIG. 5) of RF transceiver integrated circuit 204. RF transceiver integrated circuit 204 is a flip-chip packaged integrated circuit.

Although LNA 222 of FIG. 5 achieves high linearity by utilizing the MDS technique, even higher linearity requirements are sometimes imposed on an LNA in a CDMA transceiver, especially in the presence of strong receive-jammer signals and/or transmit-leakage signals. Higher linearity is usually achieved by increasing the LNA DC bias current so that increased negative feedback can be provided. The increasing of DC bias current, however, generally results in more DC power consumption and headroom problems. Furthermore, higher linearity also generally results in degraded noise figure of the LNA. In reality, the probability a strong receive-jammers or transmit-leakages being present at a given time is less than one percent. When there are no strong receive-jammers or transmit-leakages present, linearity requirements on the LNA are substantially relaxed. Due to the relaxed linearity requirements, the LNA can be made to consume less DC power and to have an improved NF.

Figure 11:
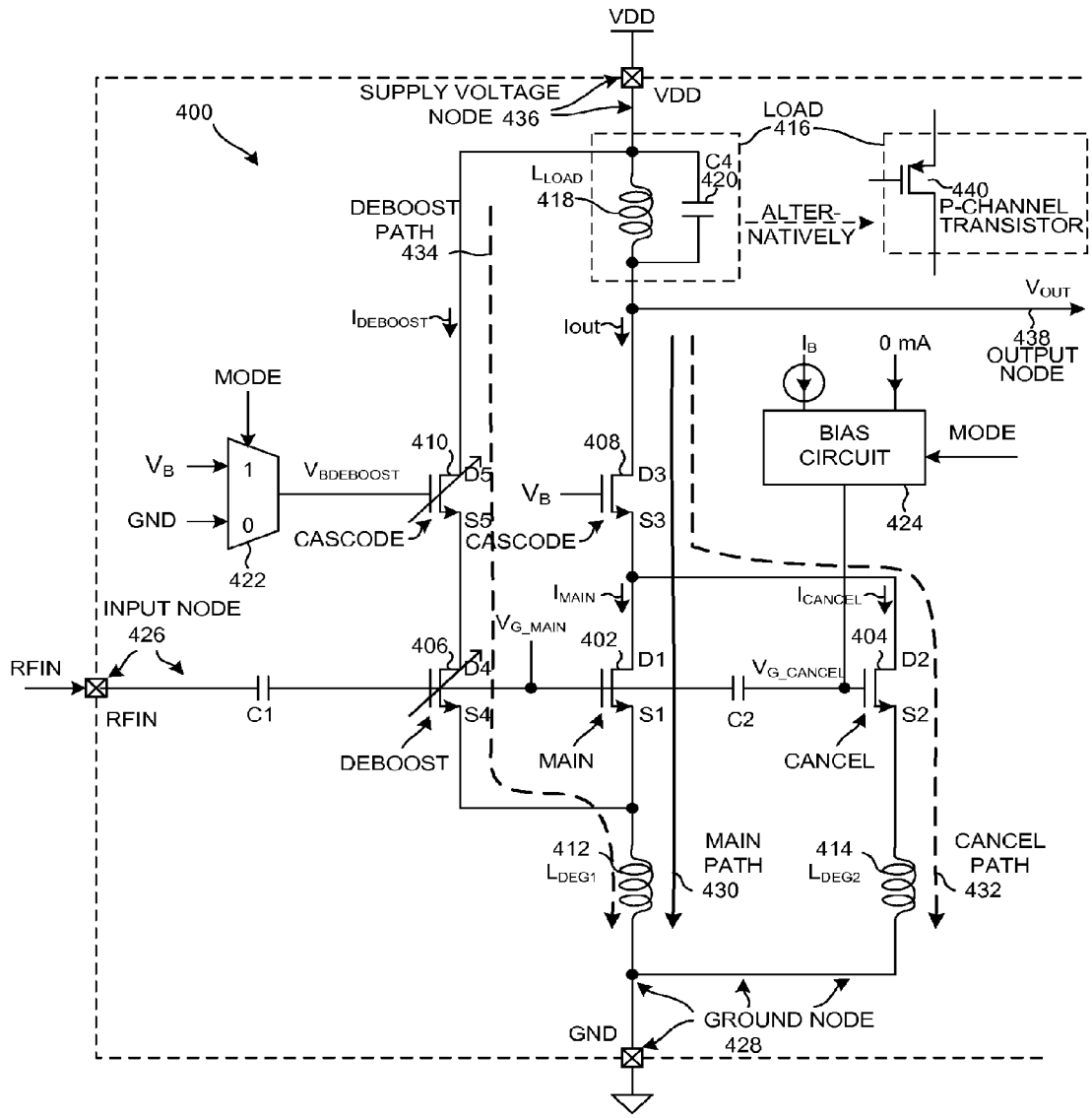
FIG. 11 is a circuit diagram of low noise amplifier (LNA) 400 that has two separate source degeneration inductors 412 and 414, and that also has a deboost transistor 406.

FIG. 11 is a circuit diagram of a low noise amplifier (LNA) 400 having two linearity operational modes in accordance with one novel aspect. LNA 400 includes a main field effect transistor (FET) 402, a cancel FET 404, a deboost transistor 406, a first cascode transistor 408, a second cascode transistor 410, a first source degeneration inductor 412, a second source degeneration inductor 414, a load 416, a multiplexer 422, and a bias circuit 424. Load 416 is an LC tank circuit that includes an inductor 418 and a capacitor 420. Main FET 402 receives an RF signal from an input node RFIN 426 through an AC coupling capacitor C1. Cancel FET 404 receives the RF signal from input node RFIN 426 though an additional AC coupling capacitor C2. A source S1 of main FET 302 is coupled to a ground node GND 428 through source degeneration inductor 412. A source S2 of cancel FET 404 is coupled to the ground node GND 428 through source degeneration inductor 414. A drain D1 of main FET 402 is connected to a drain D2 of cancel FET 404. Drain D1 and drain D2 are connected to a source S3 of cascode transistor 408. A drain D3 of cascode transistor 408 is coupled to a voltage supply node VDD 436 through load 416. Drain D3 is also coupled to an output voltage node $V_{OUT}$ 438. A gate of deboost transistor 406 is coupled to the gate of main FET 402. A source S4 of deboost transistor 406 is connected to source S1 of main FET 402. A drain D4 of deboost transistor 406 is connected to a source S5 of cascode transistor 410. Drain D5 of cascode transistor 410 is connected to voltage supply node VDD 436. Main FET 402 is biased at a bias voltage $V_{G\_MAIN}$ such that main FET 402 is biased in its saturation (also known as strong inversion) operating region. Cancel FET 404 is biased at a bias voltage $V_{G\_CANCEL}$ such that cancel FET 404 is biased in its sub-threshold (also known as weak inversion) operating region. Cascode transistor 410 is biased at a bias voltage $V_{B\_DEBOOST}$. A gate of cascode transistor 410 is coupled to an output lead of multiplexer 422.

There are three current paths in LNA 400. A first current path is a main current path 430 in which current $I_{MAIN}$ flows from load 416, through cascode transistor 408, through main FET 402, and through source degeneration inductor 412 to ground node GND 428. A second current path is a cancel current path 432 in which current $I_{CANCEL}$ flows from load 416, through cascode transistor 408, through cancel FET 404, and through source degeneration inductor 414 to ground node GND 428. A third current path is a deboost current path 434 in which current $I_{DEBOOST}$ flows from supply node VDD 436, through cascode transistor 410, through deboost transistor 406, and through source degeneration inductor 412 to ground node GND 428. Deboost current $I_{DEBOOST}$ does not flow through load 416.

LNA 400 has two linearity modes: a high linearity mode and a low linearity mode. The mode of operation is programmable based on the presence of jammer or leakage signals. When there is no jammer or leakage present, LNA 400 is made to operate in the low linearity mode. A first MODE value is supplied onto the select input lead of multiplexer 422 such that input lead 0 of multiplexer 422 is selected. As a result, $V_{B\_DEBOOST}$ is at ground and the entire deboost current path 434 is disabled. Without deboost current $I_{DEBOOST}$, LNA 400 operates in the same way as LNA 222 of FIG. 5. As described earlier, LNA 400 utilizes the MDS technique and meets a relatively high linearity requirement. When there is no jammer or leakage present, it is sometimes desired to reduce further the linearity requirement in order to improve NF performance. In one embodiment, the gate of cancel FET 404 is also connected to a bias circuit 424. When there is no jammer or leakage present, the first MODE value is also supplied to bias circuit 424 such that cancel FET 404 is supplied with zero bias current. As a result, bias voltage $V_{G\_CANCEL}$ drops to zero and the entire cancel current path 432 is disabled. In this particular embodiment, LNA 400 is a source-degenerated low noise amplifier which has very good NF but relatively low linearity.

On the other hand, when there is a jammer or leakage signal present at input node RFIN 426, LNA 400 is made to operate in the high linearity mode. In order to increase the linearity of LNA 400, the current flow through source degeneration inductor 412 is increased so that more negative feedback is provided. This increased negative feedback is achieved by increasing DC bias current of main FET 402. However, the increasing of DC bias current of main FET 402 also increases DC power consumption. Furthermore, the DC bias current cannot be increased without limit. Too much increase in DC bias current across load 416 causes the output voltage $V_{OUT}$ on output node 438 to decrease so much that there is not adequate voltage to keep main FET 402 in saturation. This voltage headroom problem becomes more prominent in low voltage supply applications because the DC bias voltage $V_{G\_MAIN}$ on main FET 402 cannot exceed the supply voltage. For example, the supply voltage of LNA 400 is typically 1.3 volts. As more current flows through load 416, more voltage is dropped across load 416. The increased voltage drop across load 416 lowers the DC output voltage on output node 438. As a result, the lower DC output voltage decreases voltage headroom of main FET 402 because DC bias voltage $V_{G\_MAIN}$ cannot exceed $V_{OUT}$ in order to ensure main FET 402 is biased in its saturation region.

Novel deboost transistor 406 operates to improve voltage headroom and therefore helps increase the linearity of LNA 400. LNA 400 operates in the high linearity mode when a second MODE value is asserted. The second MODE value is supplied onto the select input lead of multiplexer 422 such that input lead 1 of multiplexer 422 is selected. Cascode transistor 410 is thus biased at a DC bias voltage $V_{B\_DEBOOST}=V_B$. Deboost current path 434 is enabled. As illustrated in FIG. 11, deboost current $I_{DEBOOST}$ together with main current $I_{MAIN}$ flows through source degeneration inductor 412 and therefore increases the negative feedback factor on main FET 402. On the other hand, deboost current $I_{DEBOOST}$ does not flow through LNA load 416 and therefore does not lower the output voltage $V_{OUT}$ on output node 438. Accordingly, LNA 400 has higher linearity by having more negative feedback without encountering the voltage headroom problem. When LNA 400 operates in the high linearity mode, the second MODE value is also supplied to bias circuit 424 such that cancel FET 404 is supplied with a DC bias current $I_B$. DC bias current $I_B$ enables cancel current path 432. As described earlier, the third order distortion component of cancel current $I_{CANCEL}$ cancels the third order distortion component of main current $I_{MAIN}$ and results in zero IMD3 of output current $I_{OUT}$. In one example, deboost current $I_{DEBOOST}$ can be readily changed during the design process by adjusting the size of cascode transistor 410 and deboost transistor 406. Accordingly, the negative feedback associated with the main current path is also adjustable. The adjustability of the negative feedback factor provides extra tuning capability for optimal current cancellation. As a result, the LNA can be optimized with fewer design iterations.

Figures 12, 13:
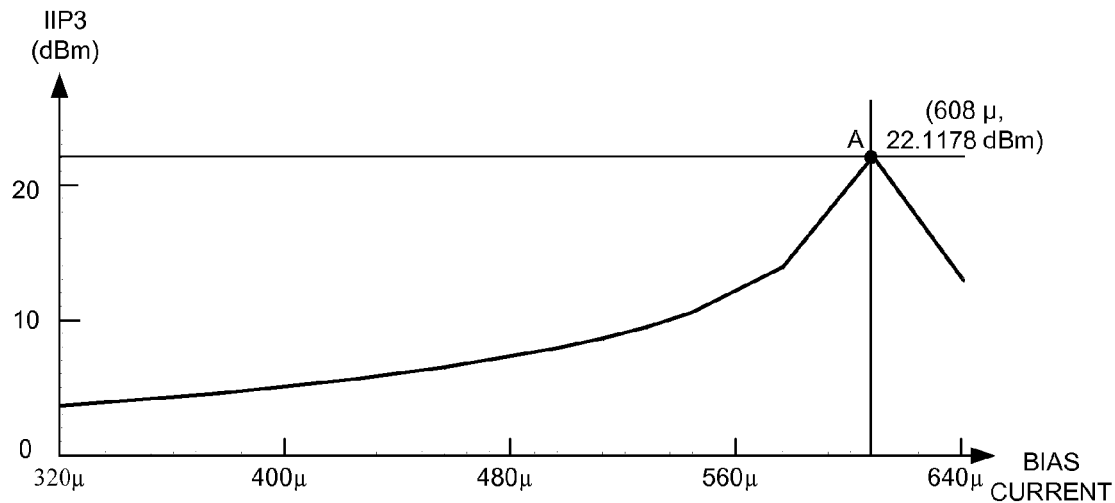
FIG. 12 is a graph showing linearity performance IIP3 of LNA 400 (when LNA 400 is operating in its high linearity mode) with respect to the bias current of cancel transistor 404 of FIG. 11.
FIG. 13 is a table that illustrates LNA performance characteristics when the LNA is operating in the high linearity mode and in the low linearity mode.

FIG. 12 is a graph showing linearity performance $IIP_3$ of LNA 400 when LNA 400 is operating in the high linearity mode with respect to bias current $I_B$ of cancel FET 404. As illustrated in FIG. 12, the $IIP_3$ of LNA 400 gradually increases as bias current $I_B$ increases from 320 microamperes. The $IIP_3$ of LNA 400 reaches its optimal point when bias current $I_B$ is at 608 microamperes, and gradually decreases when bias current $I_B$ increases further. It can be seen that $IIP_3$ can be optimized by only adjusting the bias current $I_B$ of cancel FET 404, without the need for changing any other parameters associated with main current path 430 or deboost current path 434. In the example of FIG. 12, the optimal $IIP_3$ of LNA 400 is 22.1178 dBm.

FIG. 13 is a table that illustrates LNA 400 performance characteristics in both the high linearity mode and the low linearity mode. In the high linearity mode, the $IIP_3$ is eight dBm, the noise figure is five db, and the total bias current is twenty milliamperes. The total bias current of LNA 400 includes the bias current of main FET 402, deboost transistor 406, and cancel FET 404. In one example, the bias current of main FET 402 is about 9.65 milliamperes, the bias current of deboost transistor 406 is also 9.65 milliamperes, and the bias current of cancel FET 404 is 0.7 milliamperes. In the low linearity mode, the $IIP_3$ is zero dBm, the noise figure is three db, and the total bias current is ten milliamperes. Therefore, in the low linearity mode, LNA 400 has much better noise figure and approximately half bias current as compared to LNA 400 in the high linearity mode.

Although certain specific embodiments are described above for instructional purposes, the teachings of this patent document have general applicability and are not limited to the specific embodiments described above. For example, load 416 of FIG. 11 can be a P-channel transistor 440 rather than a tank circuit. A P-channel transistor is sometimes preferred because it is a broadband load having high impedance and small die area. Accordingly, various modifications, adaptations, and combinations of the various features of the described specific embodiments can be practiced without departing from the scope of the claims that are set forth below.

What is claimed is:

1. A derivative superposition (DS) low noise amplifier (LNA) comprising: a first field effect transistor (FET) biased in a saturation region, wherein a gate of the first FET is coupled to an input node; a second FET biased in a sub-threshold region, wherein a gate of the second FET is coupled to the gate of the first FET, and wherein a drain of the second FET is coupled to a drain of the first FET; a first degeneration inductance that couples a source of the first FET to a ground node; and a second degeneration inductance independently from the first inductance that couples a source of the second FET to the ground node, and wherein the second degeneration inductance is at least one nanohenry.

2. The DS LNA of claim 1, wherein the first source degeneration inductance is a first spiral inductor, and wherein the second source degeneration inductance is a second spiral inductor.

3. The DS LNA of claim 1, wherein the ground node includes a surface-mount microbump, and wherein the first degeneration inductance includes no tap to which the second degeneration inductor is coupled.

4. The DS LNA of claim 1, wherein the gate of the second FET is capacitively coupled to the gate of the first FET, and wherein the gate of the first FET is capacitively coupled to the input node.

5. The DS LNA of claim 1, further comprising:
a load; and
a cascode transistor having a source and a drain, the source of the cascode transistor being coupled to the drain of the first FET, the drain of the cascode transistor being coupled to the load.

6. The DS LNA of claim 1, wherein the input node receives an input signal, wherein the first FET produces a first third-order distortion signal, wherein the second FET produces a second third-order distortion signal, and wherein the second third-order distortion signal at least partially cancels the first third-order distortion signal.

7. A low noise amplifier comprising:
a load coupled to a supply voltage;
a first source degeneration inductor;
a main transistor biased in a saturation region, wherein a gate of the main transistor is coupled to an input node, wherein a source of the main transistor is coupled to the first source degeneration inductor, wherein the main transistor controls a main current that flows from the supply voltage through the load, through the main transistor, and then through the first source degeneration inductor; and
a deboost transistor biased in a saturation region, wherein a gate of the deboost transistor is coupled to the gate of the main transistor, wherein a deboost current flows from the supply voltage through the deboost transistor and then through the first source degeneration inductor without flowing through the load.

8. The low noise amplifier of claim 7, further comprising:
a deboost cascode transistor, wherein a source of the deboost cascode transistor is coupled to a drain of the deboost transistor, wherein a drain of the deboost cascode transistor is coupled to a supply voltage node.

9. The low noise amplifier of claim 8, wherein a gate of the deboost cascode transistor is coupled to a selectable one of either a bias voltage node or a ground node.

10. The now noise amplifier of claim 7, further comprising:
a cancel transistor biased in a sub-threshold region, wherein the cancel transistor has a drain that is coupled to a drain of the main transistor.

11. The low noise amplifier of claim 10, further comprising:
a second source degeneration inductor having a first lead and a second lead, wherein the first lead is coupled to a source of the cancel transistor, wherein the second lead is coupled to a ground node, and wherein the ground node is coupled to the first source degeneration inductor.

12. The low noise amplifier of claim 7, wherein the load is a tank circuit.

13. The low noise amplifier of claim 7, wherein the load is a P-channel transistor.

14. The low noise amplifier of claim 10, further comprising:
a bias circuit that supplies a bias current to the cancel transistor, wherein the bias current is programmable to have either a first current value or a second current value depending on a value of a mode control signal.

15. The low noise amplifier of claim 8, further comprising:
means for disabling the deboost cascode transistor such that the deboost current does not flow through the deboost transistor.

16. A method, comprising:
(a) conducting a first current through a load, then through a first transistor biased in a saturation region, then through a first source degeneration inductor, and to a ground node; and
(b) conducting a second current through the load, then through a second transistor biased in a sub-threshold region, then through a second source degeneration inductor, and to the ground node, wherein the load, the first transistor, the second transistor, the first source degeneration inductor, and the second degeneration inductor together form a part of a low noise amplifier, and wherein the second source degeneration inductor has an inductance of at least one nanohenry.

17. The method of claim 16, further comprising:
(c) receiving a mode signal, wherein if the mode signal has a first value then enabling the second transistor such that the second current flows, wherein if the mode signal has a second value then disabling the second transistor such that the second current does not flow.

18. A method comprising:
a) receiving an input signal onto a low noise amplifier (LNA), wherein the LNA comprises a load coupled to a supply voltage, a main transistor biased in a saturation region, and a source degeneration inductance, and wherein the main transistor controls a main current that flows from the supply voltage through the load, through the main transistor, and then through the source degeneration inductance; and
(b) providing a deboost transistor capable of conducting a deboost current that flows from the supply voltage through the deboost transistor and then through the source degeneration inductance without flowing through the load.

19. The method of claim 18, further comprising:
(c) receiving a mode signal, wherein if the mode signal has a first value then enabling the deboost transistor such that the deboost current flows, wherein if the mode signal has a second value then disabling the deboost transistor such that the deboost current does not flow.

20. An apparatus, comprising:
a source degenerated low noise amplifier (LNA), wherein the LNA comprises a load coupled to a supply voltage, a main transistor biased in a saturation region, and a source degeneration inductance, and wherein the main transistor controls a first current that flows from the supply voltage through the load, then through the main transistor, and then through the source degeneration inductance; and
means for selectively increasing current flow through the source degeneration inductance without increasing the first current flowing through the load.

21. The apparatus of claim 20, wherein the means comprises a deboost transistor that controls a deboost current, wherein the deboost current flows from the supply voltage through the deboost transistor and then through the source degeneration inductance without flowing through the load.

* * * * *